(12) United States Patent
Cheah et al.

(10) Patent No.: US 12,205,919 B2
(45) Date of Patent: Jan. 21, 2025

(54) METHOD OF PROCESSING A SEMICONDUCTOR WAFER, SEMICONDUCTOR DIE, AND METHOD OF PRODUCING A SEMICONDUCTOR MODULE

(71) Applicant: Infineon Technologies AG, Neubiberg (DE)

(72) Inventors: Chuan Cheah, Torrance, CA (US); Josef Hoeglauer, Heimstetten (DE); Tobias Polster, Villach (AT)

(73) Assignee: Infineon Technologies AG, Neubiberg (DE)

( * ) Notice: Subject to any disclaimer, the term of this patent is extended or adjusted under 35 U.S.C. 154(b) by 306 days.

(21) Appl. No.: 17/555,709

(22) Filed: Dec. 20, 2021

(65) Prior Publication Data
US 2023/0197663 A1 Jun. 22, 2023

(51) Int. Cl.
| | | |
|---|---|---|
| H01L 21/78 | (2006.01) | |
| H01L 21/56 | (2006.01) | |
| H01L 23/00 | (2006.01) | |
| H01L 23/373 | (2006.01) | |
| H01L 23/538 | (2006.01) | |
| H01L 25/00 | (2006.01) | |
| H01L 25/07 | (2006.01) | |

(Continued)

(52) U.S. Cl.
CPC ............ *H01L 24/24* (2013.01); *H01L 21/568* (2013.01); *H01L 21/78* (2013.01); *H01L 23/5389* (2013.01); *H01L 24/82* (2013.01); *H01L 25/072* (2013.01); *H01L 25/50* (2013.01); *H01L 29/401* (2013.01); *H01L 23/3736* (2013.01); *H01L 29/45* (2013.01); *H01L 2224/24137* (2013.01); *H01L 2224/24155* (2013.01); *H01L 2224/82106* (2013.01)

(58) Field of Classification Search
CPC ....... H01L 24/24; H01L 24/82; H01L 25/072; H01L 25/50; H01L 21/568; H01L 21/78; H01L 23/5389; H01L 23/3736; H01L 29/401; H01L 29/45; H01L 2224/24137; H01L 2224/24155; H01L 2224/82106
See application file for complete search history.

(56) References Cited

U.S. PATENT DOCUMENTS

| | | |
|---|---|---|
| 6,023,100 A | 2/2000 | Tao et al. |
| 2002/0163083 A1 | 11/2002 | Hatano et al. |

(Continued)

*Primary Examiner* — Timor Karimy
(74) *Attorney, Agent, or Firm* — Murphy, Bilak & Homiller, PLLC

(57) ABSTRACT

A method of processing a semiconductor wafer includes: forming an electronic device at each die location of the semiconductor wafer; partially forming a frontside metallization over a frontside of the semiconductor wafer at each die location; partially forming a backside metallization over a backside of the semiconductor wafer at each die location; and after partially forming both the frontside metallization and the backside metallization but without completing either the frontside metallization or the backside metallization, singulating the semiconductor wafer between the die locations to form a plurality of individual semiconductor dies, wherein the partially formed frontside metallization and the partially formed backside metallization have a same composition. Semiconductor dies and methods of producing semiconductor modules are also described.

6 Claims, 7 Drawing Sheets

(51) Int. Cl.
*H01L 29/40* (2006.01)
*H01L 29/45* (2006.01)

(56) References Cited

U.S. PATENT DOCUMENTS

| | | |
|---|---|---|
| 2004/0224495 A1 | 11/2004 | Young |
| 2005/0221554 A1 | 10/2005 | Huang |
| 2008/0191359 A1* | 8/2008 | Koller ................ H01L 23/3114 |
| | | 438/758 |
| 2011/0240354 A1* | 10/2011 | Furuhata ................ H01L 24/20 |
| | | 29/830 |

* cited by examiner

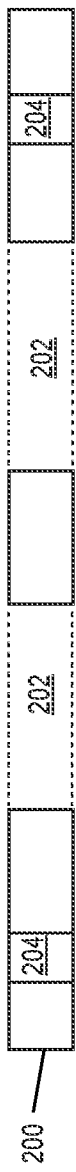
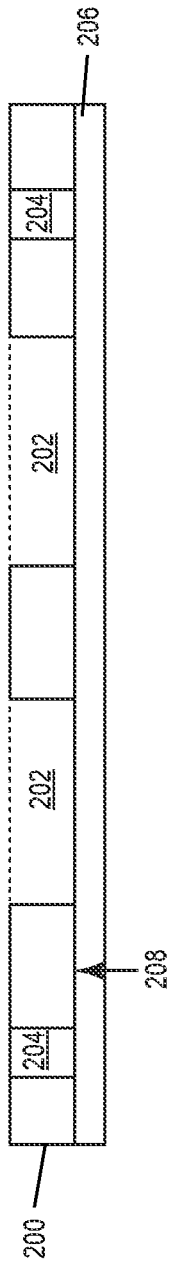
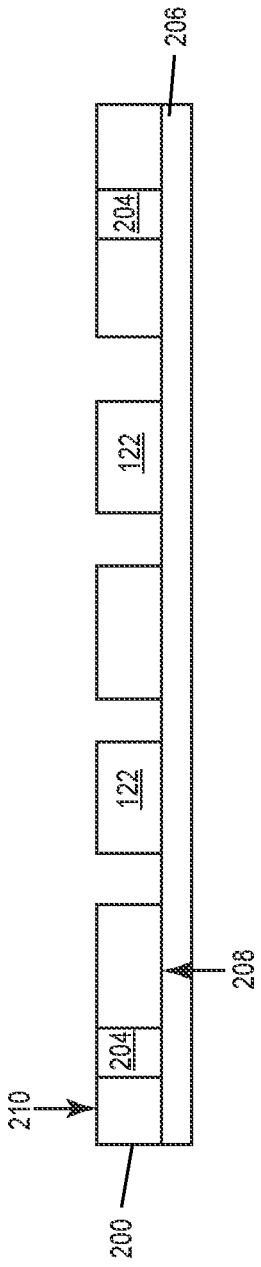
FIG. 2A
FIG. 2B
FIG. 2C

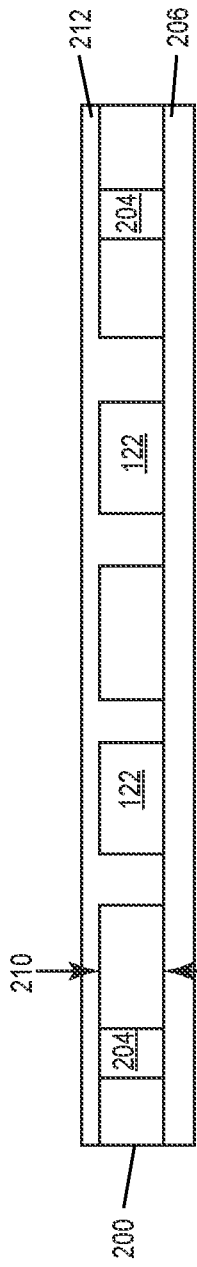
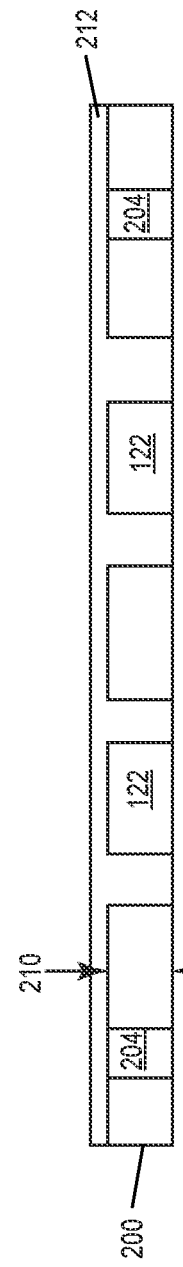
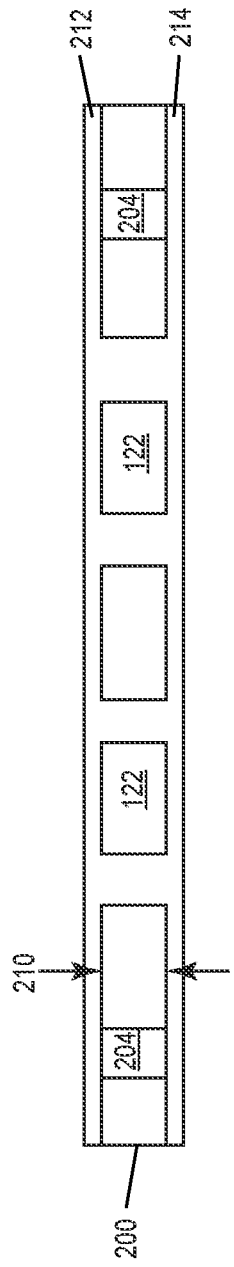

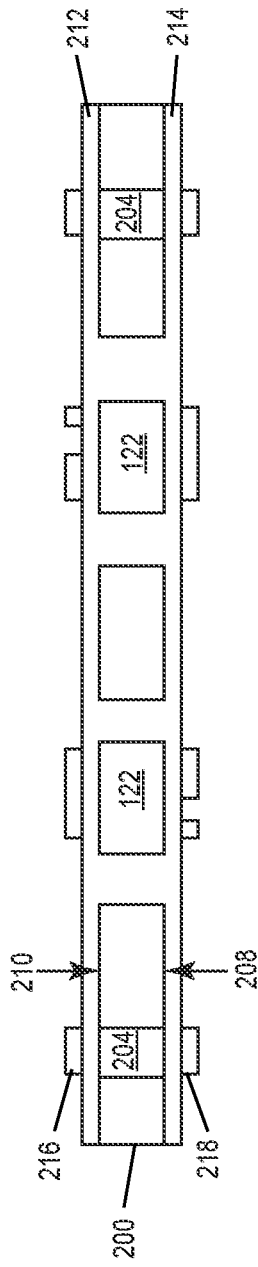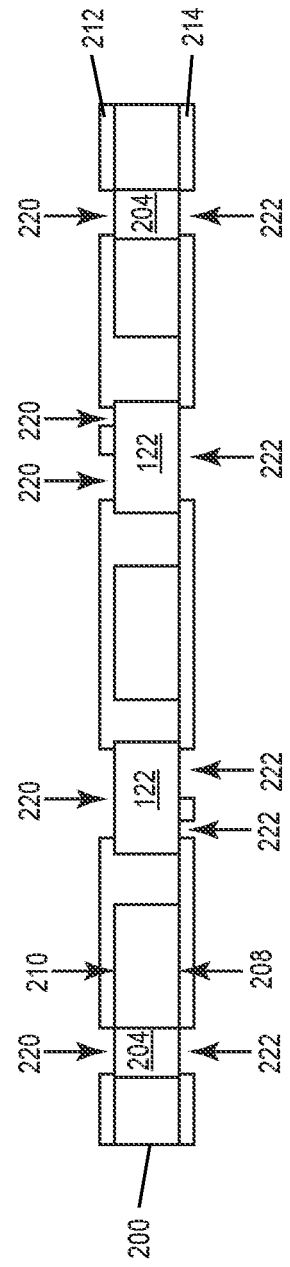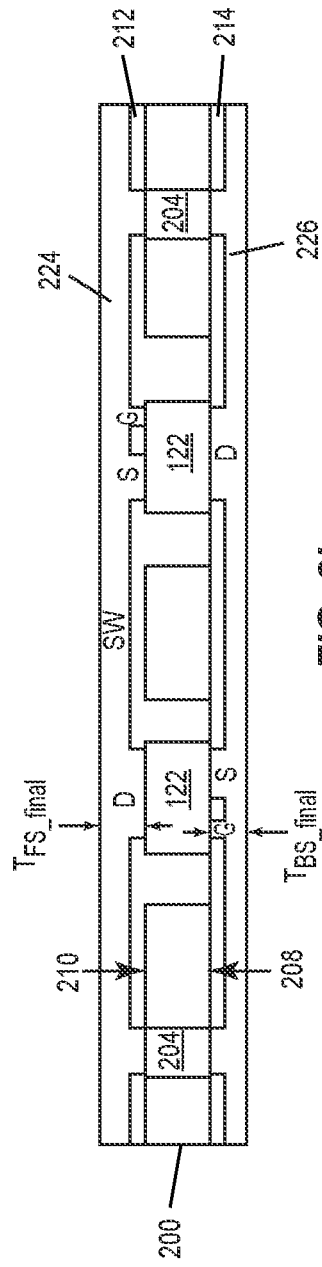

METHOD OF PROCESSING A SEMICONDUCTOR WAFER, SEMICONDUCTOR DIE, AND METHOD OF PRODUCING A SEMICONDUCTOR MODULE

BACKGROUND

Semiconductor manufacturing involves formation of metallization at the front and back sides of semiconductor wafers. The metallization systems at the front and back sides of a semiconductor wafer are often different in material composition, number of layers, type of layers, etc. Accommodating a wide variety of metallization materials and layer types result in an overly complex manufacturing process.

Thus, there is a need for a simplified metallization process for use in producing semiconductor wafers.

SUMMARY

According to an embodiment of a method of processing a semiconductor wafer, the method comprises: forming an electronic device at each die location of the semiconductor wafer; partially forming a frontside metallization over a frontside of the semiconductor wafer at each die location; partially forming a backside metallization over a backside of the semiconductor wafer at each die location; and after partially forming both the frontside metallization and the backside metallization but without completing either the frontside metallization or the backside metallization, singulating the semiconductor wafer between the die locations to form a plurality of individual semiconductor dies, wherein the partially formed frontside metallization and the partially formed backside metallization have a same composition.

According to an embodiment of a semiconductor die, the semiconductor die comprises: a semiconductor substrate; an electronic device formed in the semiconductor substrate; a partially formed frontside metallization disposed over a frontside of the semiconductor substrate; and a partially formed backside metallization disposed over a backside of the semiconductor substrate, wherein the partially formed frontside metallization and the partially formed backside metallization have a same composition.

According to an embodiment of a method of producing a semiconductor module, the method comprises: adhering an adhesive layer to a backside of an electrically insulative core having a plurality of openings; placing a semiconductor die in each opening of the electrically insulative core at a frontside of the electrically insulative core such that each semiconductor die adheres to the adhesive layer, each semiconductor die including a partially formed frontside metallization and a partially formed backside metallization of a same composition; laminating the electrically insulative core with a dielectric material such that the dielectric material covers both the backside and the frontside of the electrically insulative core and fills gaps between sidewalls of the openings in the electrically insulative core and the semiconductor dies placed in the openings; forming openings in the dielectric material that expose parts of the partially formed frontside metallization and the partially formed backside metallization of each semiconductor die; and forming one or more metal layers on the exposed parts of the partially formed frontside metallization and the partially formed backside metallization of each semiconductor die, to establish a final thickness for the frontside metallization and the backside metallization of each semiconductor die.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A through 2J illustrate partial cross-section views of an embodiment of a method of producing a semiconductor module.

DETAILED DESCRIPTION

The embodiments described provide a reduced complexity metallization process for use in producing semiconductor wafers. Semiconductor dies produced from the wafer production method are also described, as is a method of producing semiconductor modules that include the semiconductor dies. The wafer production method includes partially forming both the wafer frontside metallization and the wafer backside metallization, the partially formed frontside metallization and the partially formed backside metallization having the same composition. Without first completing either the frontside metallization or the backside metallization, the semiconductor wafer is singulated between die locations to form individual semiconductor dies. The wafer metallization process described herein has less complexity and lower cost compared to conventional wafer metallization processes which involve forming complete frontside and backside wafer metallizations that typically comprise different materials.

Described next, with reference to the figures, are exemplary embodiments of the reduced complexity metallization process for use in producing semiconductor wafers, semiconductor dies produced from the wafer production method, and a method of producing semiconductor modules that include the semiconductor dies.

Figure 1A:
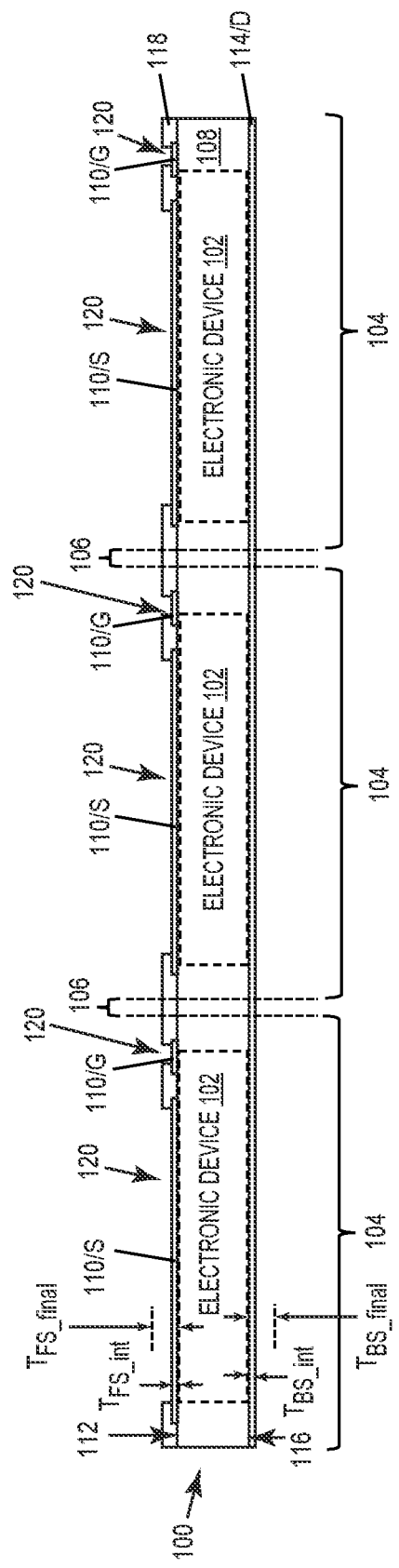
FIGS. 1A and 1B illustrate partial cross-sectional views of an embodiment of a method of processing a semiconductor wafer.
Figure 1B:
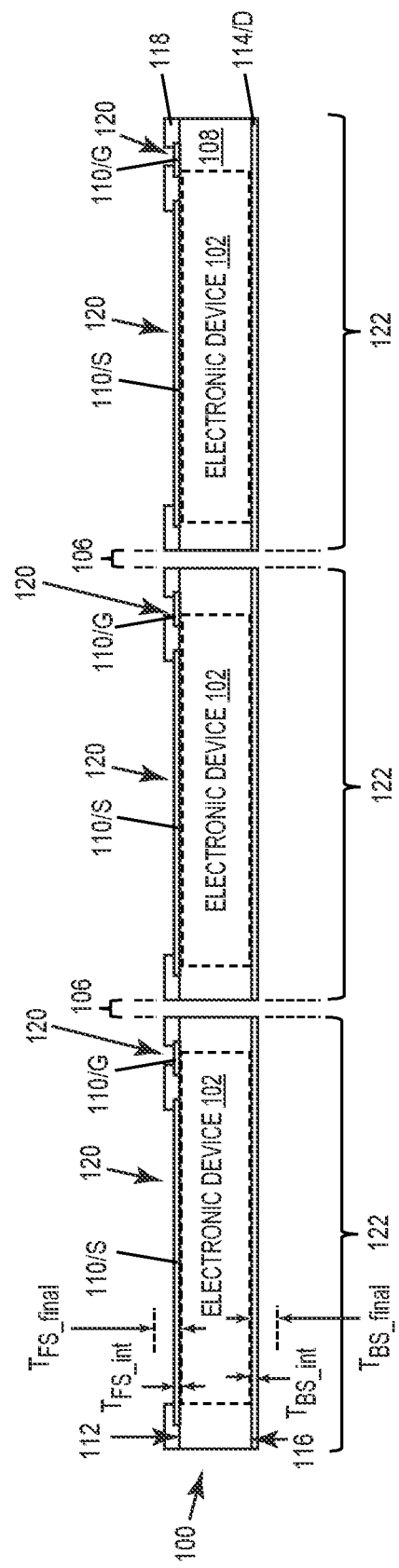

FIGS. 1A and 1B illustrate cross-sectional views of an embodiment of a method of processing a semiconductor wafer 100. FIG. 1A shows the semiconductor wafer 100 prior to singulation (dicing) and FIG. 1B shows the semiconductor wafer 100 after singulation. Only part of the semiconductor wafer 100 is shown in FIGS. 1A and 1B.

The method of processing the semiconductor wafer 100 includes forming an electronic device 102 at each die location 104 of the semiconductor wafer 100. Prior to singulation, a dicing street 106 connects adjacent dies. The dicing street 106 corresponds to the region of the semiconductor wafer 100 between the die locations 104 that is to be singulated, e.g., by sawing, laser cutting, etching, etc. to form individual semiconductor dies. The electronic device 102 formed at each die location 104 may be a power device such as a power diode or a power transistor like a power MOSFET (metal-oxide-semiconductor field-effect transistor), HEMT (high-electron mobility transistor), IGBT (insulated-gate bipolar transistor), JFET (junction filed-effect transistor), etc. Some or all electronic devices 102 instead may be ICs (integrated circuits) such as gate drivers, controllers, etc. or other types of devices such as sensors, for example.

The semiconductor wafer 100 comprises one or more semiconductor materials 108 that are used to form the electronic devices 102. For example, the semiconductor wafer 100 may comprise Si, silicon carbide (SiC), germanium (Ge), silicon germanium (SiGe), gallium nitride (GaN), gallium arsenide (GaAs), and the like. The semiconductor wafer 100 may be a bulk semiconductor material or may include one or more epitaxial layers grown on a bulk semiconductor material.

FIG. 1A shows the semiconductor wafer 100 after partially forming a frontside metallization 110 over the frontside 112 of the semiconductor wafer 100 at each die location 104 and after partially forming a backside metallization 114 over the backside 116 of the semiconductor wafer 100 at each die location 104. The phrase 'partially forming' as used herein means that the frontside and backside metallizations 110, 114 have not been produced to their respective final target thicknesses $T_{FS\_final}$, $T_{BS\_final}$ and therefore may not be suitable to handle the maximum current during operation of the electronic devices 102, e.g., in the case of power transistors.

The final thickness $T_{FS\_final}$ of the partially formed frontside metallization 110 and the final thickness $T_{BS\_final}$ of the partially formed backside metallization 114 is not set at the time of wafer processing, which includes singulation, but instead at a later point in time. Accordingly, the partially formed frontside metallization 110 has an intermediate (i.e., non-finished) thickness $T_{FS\_int}$ and the partially formed backside metallization 114 has an intermediate (i.e., non-finished) thickness $T_{BS\_int}$ at the completion of the wafer production process which is less than the respective final target thicknesses $T_{FS\_final}$, $T_{BS\_final}$. Subsequent processing is performed post wafer production (i.e., after singulation), e.g., during module assembly to yield the final frontside metallization thickness $T_{FS\_final}$ and the final backside metallization thickness $T_{BS\_final}$. Accordingly, both the frontside metallization 110 and the backside metallization 114 are incomplete from the perspective of thickness at the end of the wafer production process which includes singulation.

Furthermore, the partially formed frontside metallization 110 and the partially formed backside metallization 114 have a same metal or metal alloy composition to further reduce the complexity of the wafer production process. In one embodiment, the partially formed frontside metallization 110 and the partially formed backside metallization 114 both comprise Al (aluminum). In another embodiment, the partially formed frontside metallization 110 and the partially formed backside metallization 114 both comprise AlCu (aluminum copper).

The partially formed frontside metallization 110 and the partially formed backside metallization 114 may comprise a single layer of the same metal or metal alloy such as Al, Cu, Au, Pd, Ag, Ni, or alloys thereof. In another embodiment, the partially formed frontside metallization 110 is a multilayer stack of different metals and/or metal alloys and the partially formed backside metallization 114 comprises the same multi-layer stack of different metals and/or metal alloys as the partially formed frontside metallization 110.

The partially formed frontside metallization 110 and/or the partially formed backside metallization 114 may be patterned. For example, the electronic device 102 formed at each die location 104 of the semiconductor wafer 100 may be a vertical power transistor. The gate electrode 'G' and the source electrode 'S' of the vertical power transistor may be disposed at the frontside 112 of each die location 104 and the drain electrode 'D' of the vertical power transistor die may be disposed at the backside 116 of each die location 104. The partially formed frontside metallization 110 may be patterned and form the gate electrode G and the source electrode S of the vertical power transistor, and the partially formed backside metallization 114 may form the drain electrode D of the vertical power transistor. A passivation 118 such as polyimide may be formed on the partially formed frontside metallization 110 and have openings 120 that expose the gate and source electrodes G, S of the vertical power transistor.

In another embodiment, the electronic device 102 formed at each die location 104 of the semiconductor wafer 100 may be a driver or controller for a power transistor. Each electrode of the driver or controller may be disposed at the frontside 112 of each die location 104 and the partially formed frontside metallization 110 may be patterned and form each electrode of the driver or controller. The partially formed backside metallization 114 of each may form a heat dissipation structure at the backside 116 of each die location 104.

FIG. 1B shows the semiconductor wafer 100 after the singulation process. After partially forming both the frontside metallization 110 and the backside metallization 114 but without completing either the frontside metallization 110 or the backside metallization 114, the semiconductor wafer 100 is singulated between the die locations 104 to form individual semiconductor dies 122. The final thickness $T_{FS\_final}$ of the partially formed frontside metallization 110 and the final thickness $T_{BS\_final}$ of the partially formed backside metallization 114 are not set at the time of wafer singulation. Accordingly, the individual semiconductor dies 122 produced from the semiconductor wafer 100 are incomplete in that both the frontside metallization 110 and the backside metallization 114 have an intermediate thickness $T_{FS\_int}$, $T_{BS\_int}$ less than the respective final target thicknesses $T_{FS\_final}$, $T_{BS\_final}$.

The individual semiconductor dies 122 are fully functional but may not be suitable to handle the maximum rated current due to the incomplete/partial thickness $T_{FS\_int}$, $T_{BS\_int}$ of the frontside and backside metallizations 110, 114. The final thicknesses $T_{FS\_final}$, $T_{BS\_final}$ may be realized, e.g., during module assembly where one or more additional metal or metal alloy layers are deposited on the frontside metallization 110 and the backside metallization 114. The same or different metallization and/or metallization stacks may be used to complete the final thicknesses $T_{FS\_final}$, $T_{BS\_final}$ of the frontside and backside metallizations 110, 114.

FIGS. 2A through 2J illustrate an embodiment of a method of producing a semiconductor module from the individual semiconductor dies 122 produced from the semiconductor wafer 100. FIGS. 2A through 2J are partial cross-sectional views during different stages of the module production process. More than one semiconductor module may be produced at the same time via batch processing.

FIG. 2A shows an electrically insulative core 200 having openings 202. The electrically insulative core 200 may be a laminate, e.g., such as a prepreg (pre-impregnated) material used in PCB (printed circuit board) production. The electrically insulative core 200 may have electrically conductive structures 204 such as Cu vias or blocks embedded therein.

FIG. 2B shows adhering an adhesive layer 206 to the backside 208 of the electrically insulative core 200. The adhesive layer 206 may be an adhesive tape, for example.

Figure 2J:
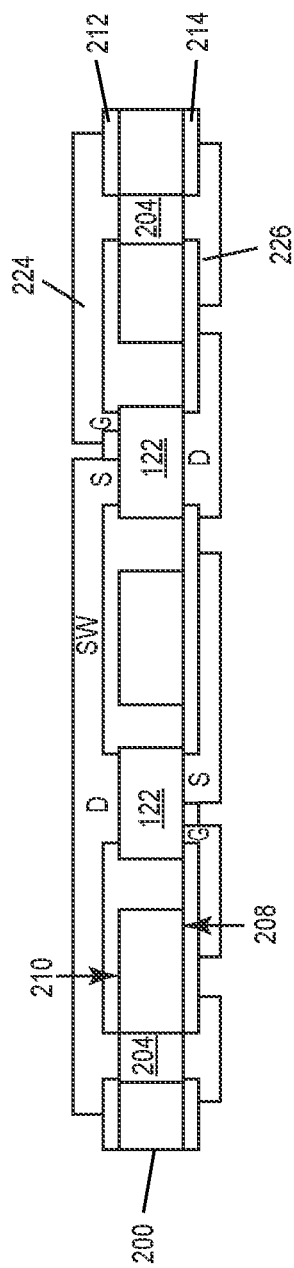

FIG. 2C shows placing a semiconductor die 122 in each opening 202 of the electrically insulative core 200 at the frontside 210 of the electrically insulative core 200 such that each semiconductor die 122 adheres to the adhesive layer 206. Each semiconductor die 122 includes a partially formed frontside metallization 110 and a partially formed backside metallization 114 of the same composition, as explained above in connection with FIGS. 1A and 1B. The partially formed frontside metallization 110 and the partially formed backside metallization 114 of each die 122 are not shown in FIGS. 2A through 2J to emphasize other aspects of the module production process.

The dies 122 may face the same way or face different ways. For example, the partially formed backside metallization 114 of each die 122 may be adhered to the adhesive layer 206. In another embodiment, the some of the dies 122 are placed in the openings 202 such that the partially formed backside metallization 114 adheres to the adhesive layer 206 whereas other ones of the dies 122 are placed in the openings 202 such that the partially formed frontside metallization 110 adheres to the adhesive layer 206. Such a configuration may be useful in the case of half bridge modules constructed from power transistor dies.

FIG. 2D shows laminating the electrically insulative core 200 with a first dielectric material 212. The first dielectric material 212 covers the frontside 210 of the electrically insulative core 200 and fills the gaps between sidewalls of the openings 202 in the electrically insulative core 200 and the semiconductor dies 122 placed in the openings 202. In one embodiment, the first dielectric material 212 is a photoimageable dielectric. In another embodiment, the first dielectric material 212 is a thermosetting film comprising an organic epoxy resin, a hardener, and an inorganic filler.

FIG. 2E shows the structure after removal of the adhesive layer 206. The adhesive layer 206 may be removed after laminating the electrically insulative core 200 with the first dielectric material 212.

FIG. 2F shows forming a second dielectric material 214 on the backside 208 of the electrically insulative core 200. In one embodiment, the second dielectric material 214 is a photoimageable dielectric. In another embodiment, the second dielectric material 214 is a thermosetting film comprising an organic epoxy resin, a hardener, and an inorganic filler. The first and second dielectric materials 212, 214 may comprise the same material, for example.

FIG. 2G shows forming a first mask 216 on the first dielectric material 212 at the frontside 210 of the electrically insulative core 200 and a second mask 218 on the second dielectric material 214 at the backside 208 of the electrically insulative core 200. The masks 216, 218 may be photoresist, e.g., and are used to alter one or properties of the dielectric materials 212, 214 such that unreacted parts of the dielectric materials 212, 214 may be etched selectively to the reacted parts of the dielectric materials 212, 214.

FIG. 2H shows openings 220 formed in the first dielectric material 212 that expose parts of the partially formed frontside metallization 110 of each semiconductor die and openings 222 formed in the second dielectric material 214 that expose parts of the partially formed backside metallization 114 of each semiconductor die 122. The openings 220, 222 may be formed by etching away the unreacted parts of the dielectric materials 212, 214. The openings 220, 222 may also expose the electrically conductive structures 204 at the frontside 210 and backside 208 of the electrically insulative core 200.

FIG. 2I shows forming one or more metal layers 224 on the exposed parts of the partially formed frontside metallization 110 and one or more metal layers 226 on the exposed parts of the partially formed backside metallization 114 of each semiconductor die 122, to establish a final thickness $T_{FS\_final}$ for the frontside metallization 110 and a final thickness $T_{BS\_final}$ for the backside metallization 114 of each semiconductor die 122. The metal layer(s) 224, 226 may comprise plated Cu (copper), for example. In general, the same or different metal(s) or metal alloy(s) may be used to complete the final thicknesses $T_{FS\_final}$, $T_{BS\_final}$ of the frontside and backside metallizations 110, 114 of each semiconductor die 122.

The metal layers 224, 226 may electrically interconnect the semiconductor dies 122 included in the same module. In the case of power transistors, the metal layers 224, 226 may electrically interconnect the semiconductor dies 122 included in the same module in a half bridge configuration. In this example, the source and gate electrodes S, G for one die 122 of a half bridge pair face up with the drain electrode D facing down and the source and gate electrodes S, G for the other die 122 of the half bridge pair face down with the drain electrode D facing up. The metal layers 224, 226 may electrically connect the drain electrode D of one die 122 to the source electrode S of the other die 122 to form a switch node output or phase electrode 'SW'. The electrically conductive structures 204 embedded in the electrically insulative core 200 may be used to bring all electrical connections to the same side of each module.

FIG. 2J shows patterning of the frontside metal layer(s) 224 and of the backside metal layer(s) 226, to complete the electrical connections between the semiconductor dies 122 and/or to provide redistribution. Standard masking and etching may be used to pattern the frontside and backside metal layer(s) 224, 226.

Figure 3:
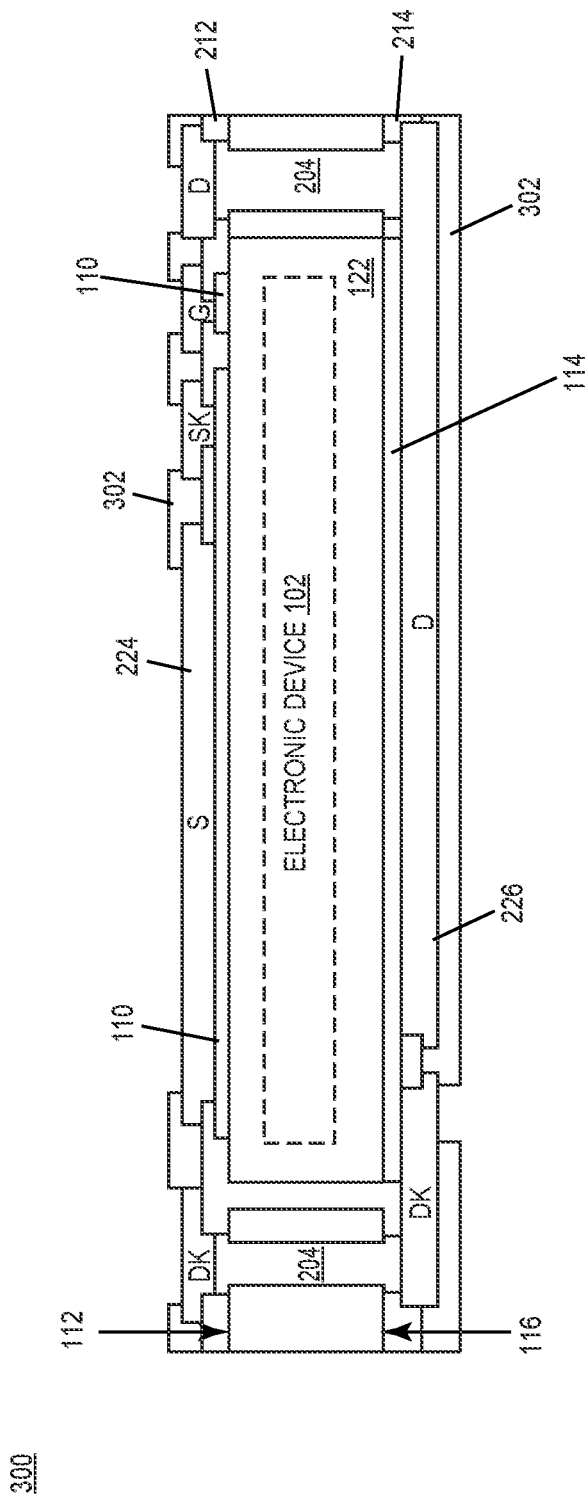
FIG. 3 illustrates a cross-section view of an embodiment of a semiconductor module produced by the method illustrated in FIGS. 2A and 2J.

FIG. 3 illustrates an embodiment of a semiconductor module 300 produced by the method illustrated in FIGS. 2A and 2J. According to this embodiment, the semiconductor module 300 includes a vertical power transistor die 122 having a backside drain electrode D and frontside gate and source electrodes G, S. The vertical power transistor die 122 may also have a frontside sense electrode SK for sensing the source or emitter current and/or a backside sense electrode DK for sensing the drain or collector current. If one or more additional metal layers are to be produced for implementing further interconnects and/or routing, a patterned solder resist 302 may be formed on the frontside and/or backside metal layer(s) 224, 226 to enable further metal deposition such as Cu plating.

Although the present disclosure is not so limited, the following numbered examples demonstrate one or more aspects of the disclosure.

Example 1. An embodiment of a method of processing a semiconductor wafer, comprising: forming an electronic device at each die location of the semiconductor wafer; partially forming a frontside metallization over a frontside of the semiconductor wafer at each die location; partially forming a backside metallization over a backside of the semiconductor wafer at each die location; and after partially forming both the frontside metallization and the backside metallization but without completing either the frontside metallization or the backside metallization, singulating the semiconductor wafer between the die locations to form a plurality of individual semiconductor dies, wherein the partially formed frontside metallization and the partially formed backside metallization have a same composition.

Example 2. The method of example 1, wherein the partially formed frontside metallization and the partially formed backside metallization both comprise Al (aluminum).

Example 3. The method of example 1, wherein the partially formed frontside metallization and the partially formed backside metallization both comprise AlCu (aluminum copper).

Example 4. The method of any of examples 1 through 3, wherein the partially formed frontside metallization is a multi-layer stack of different metals and/or metal alloys, and wherein the partially formed backside metallization comprises the same multi-layer stack of different metals and/or metal alloys as the partially formed frontside metallization.

Example 5. The method of any of examples 1 through 4, wherein the electronic device included in each individual semiconductor die is a vertical power transistor, wherein a gate electrode and a source electrode of the vertical power transistor is disposed at a first side of each individual semiconductor die, wherein a drain electrode of the vertical power transistor die is disposed at a second side of each individual semiconductor die opposite the first side, wherein the partially formed frontside metallization of each individual semiconductor die is patterned and forms the gate electrode and the source electrode of the vertical power transistor, and wherein the partially formed backside metallization of each individual semiconductor die forms the drain electrode of the vertical power transistor.

Example 6. The method of any of examples 1 through 4, wherein the electronic device included in each individual semiconductor die is a driver or controller for a power transistor, wherein each electrode of the driver or controller is disposed at a first side of each individual semiconductor die, wherein the partially formed frontside metallization of each individual semiconductor die is patterned and forms each electrode of the driver or controller, and wherein the partially formed backside metallization of each individual semiconductor die forms a heat dissipation structure at a second side opposite the first side.

Example 7. A semiconductor die, comprising: a semiconductor substrate; an electronic device formed in the semiconductor substrate; a partially formed frontside metallization disposed over a frontside of the semiconductor substrate; and a partially formed backside metallization disposed over a backside of the semiconductor substrate, wherein the partially formed frontside metallization and the partially formed backside metallization have a same composition.

Example 8. The semiconductor die of example 7, wherein the partially formed frontside metallization and the partially formed backside metallization both comprise Al (aluminum).

Example 9. The semiconductor die of example 7, wherein the partially formed frontside metallization and the partially formed backside metallization both comprise AlCu (aluminum copper).

Example 10. The semiconductor die of any of examples 7 through 9, wherein the partially formed frontside metallization is a multi-layer stack of different metals and/or metal alloys, and wherein the partially formed backside metallization comprises the same multi-layer stack of different metals and/or metal alloys as the partially formed frontside metallization.

Example 11. The semiconductor die of any of examples 7 through 10, wherein the electronic device is a vertical power transistor, wherein a gate electrode and a source electrode of the vertical power transistor is disposed at a first side of the semiconductor die, wherein a drain electrode of the vertical power transistor die is disposed at a second side of the semiconductor die opposite the first side, wherein the partially formed frontside metallization is patterned and forms the gate electrode and the source electrode of the vertical power transistor, and wherein the partially formed backside metallization forms the drain electrode of the vertical power transistor.

Example 12. The semiconductor die of any of examples 7 through 10, wherein the electronic device is a driver or controller for a power transistor, wherein each electrode of the driver or controller is disposed at a first side of the semiconductor die, wherein the partially formed frontside metallization is patterned and forms each electrode of the driver or controller, and wherein the partially formed backside metallization forms a heat dissipation structure at a second side of the semiconductor die opposite the first side.

Example 13. A method of producing a semiconductor module, the method comprising: adhering an adhesive layer to a backside of an electrically insulative core having a plurality of openings; placing a semiconductor die in each opening of the electrically insulative core at a frontside of the electrically insulative core such that each semiconductor die adheres to the adhesive layer, each semiconductor die including a partially formed frontside metallization and a partially formed backside metallization of a same composition; laminating the electrically insulative core with a dielectric material such that the dielectric material covers both the backside and the frontside of the electrically insulative core and fills gaps between sidewalls of the openings in the electrically insulative core and the semiconductor dies placed in the openings; forming openings in the dielectric material that expose parts of the partially formed frontside metallization and the partially formed backside metallization of each semiconductor die; and forming one or more metal layers on the exposed parts of the partially formed frontside metallization and the partially formed backside metallization of each semiconductor die, to establish a final thickness for the frontside metallization and the backside metallization of each semiconductor die.

Example 14. The method of example 13, wherein the one or more metal layers electrically interconnect the semiconductor dies.

Example 15. The method of example 14, wherein the one or more metal layers electrically interconnect the semiconductor dies in a half bridge configuration.

Example 16. The method of any of examples 13 through 15, wherein the dielectric material is a photoimageable dielectric.

Example 17. The method of any of examples 13 through 15, wherein the dielectric material is a thermosetting film comprising an organic epoxy resin, a hardener, and an inorganic filler.

Example 18. The method of any of examples 13 through 17, wherein for each semiconductor die, the partially formed frontside metallization and the partially formed backside metallization both comprise Al (aluminum).

Example 19. The method of any of examples 13 through 17, wherein for each semiconductor die, the partially formed frontside metallization and the partially formed backside metallization both comprise AlCu (aluminum copper).

Example 20. The method of any of examples 13 through 19, wherein for each semiconductor die, the partially formed frontside metallization is a multi-layer stack of different metals and/or metal alloys and the partially formed backside metallization comprises the same multi-layer stack of different metals and/or metal alloys as the partially formed frontside metallization.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of processing a semiconductor wafer, the method comprising:
   forming an electronic device at each die location of the semiconductor wafer;
   partially forming a frontside metallization over a frontside of the semiconductor wafer at each die location;
   partially forming a backside metallization over a backside of the semiconductor wafer at each die location; and
   after partially forming both the frontside metallization and the backside metallization but without completing either the frontside metallization or the backside metallization, singulating the semiconductor wafer between the die locations to form a plurality of individual semiconductor dies,
   wherein the partially formed frontside metallization and the partially formed backside metallization have a same composition.

2. The method of claim 1, wherein the partially formed frontside metallization and the partially formed backside metallization both comprise Al (aluminum).

3. The method of claim 1, wherein the partially formed frontside metallization and the partially formed backside metallization both comprise AlCu (aluminum copper).

4. The method of claim 1, wherein the partially formed frontside metallization is a multi-layer stack of different metals and/or metal alloys, and wherein the partially formed backside metallization comprises the same multi-layer stack of different metals and/or metal alloys as the partially formed frontside metallization.

5. The method of claim 1, wherein the electronic device included in each individual semiconductor die is a vertical power transistor, wherein a gate electrode and a source electrode of the vertical power transistor is disposed at a first side of each individual semiconductor die, wherein a drain electrode of the vertical power transistor die is disposed at a second side of each individual semiconductor die opposite the first side, wherein the partially formed frontside metallization of each individual semiconductor die is patterned and forms the gate electrode and the source electrode of the vertical power transistor, and wherein the partially formed backside metallization of each individual semiconductor die forms the drain electrode of the vertical power transistor.

6. The method of claim 1, wherein the electronic device included in each individual semiconductor die is a driver or controller for a power transistor, wherein each electrode of the driver or controller is disposed at a first side of each individual semiconductor die, wherein the partially formed frontside metallization of each individual semiconductor die is patterned and forms each electrode of the driver or controller, and wherein the partially formed backside metallization of each individual semiconductor die forms a heat dissipation structure at a second side opposite the first side.

* * * * *